US012785712B2

(12) United States Patent
Liu et al.

(10) Patent No.: US 12,785,712 B2
(45) Date of Patent: Nov. 3, 2026

(54) SUCCESSIVE APPROXIMATION REGISTER ANALOG TO DIGITAL CONVERTER WITH COMPARATOR PERFORMANCE CALIBRATION

(71) Applicant: Avago Technologies International Sales Pte. Limited, Singapore (SG)

(72) Inventors: Chang Liu, Irvine, CA (US); Xiaoliang Li, Irvine, CA (US); Haitao Tong, Laguna Hills, CA (US); Boyu Hu, Irvine, CA (US); Guansheng Li, Irvine, CA (US); Delong Cui, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 143 days.

(21) Appl. No.: 18/788,569

(22) Filed: Jul. 30, 2024

(65) Prior Publication Data

US 2026/0039309 A1 Feb. 5, 2026

(51) Int. Cl.
*H03M 1/12* (2006.01)
*H03M 1/46* (2006.01)

(52) U.S. Cl.
CPC ............ *H03M 1/46* (2013.01); *H03M 1/462* (2013.01); *H03M 1/466* (2013.01)

(58) Field of Classification Search
CPC ............ H03M 1/12; H03M 1/46; H03M 1/10; H03M 1/466
USPC ......................... 341/118, 120, 144, 155, 126
See application file for complete search history.

(56) References Cited

U.S. PATENT DOCUMENTS

| | | | | |
|---|---|---|---|---|
| 5,589,832 | A | 12/1996 | Grundvig et al. | |
| 6,144,331 | A | 11/2000 | Jiang | |
| 8,264,268 | B2 | 9/2012 | Cho et al. | |
| 8,957,802 | B1 | 2/2015 | Evans | |
| 9,379,726 | B1 | 6/2016 | Wang et al. | |
| 9,397,726 | B2 | 7/2016 | Dobyns | |
| 9,485,039 | B1 | 11/2016 | Malkin et al. | |
| 9,520,891 | B1 | 12/2016 | Kull et al. | |
| 9,584,144 | B1 | 2/2017 | Zhou et al. | |
| 10,116,318 | B1 | 10/2018 | Sharif et al. | |
| 10,128,867 | B1 | 11/2018 | Van Elzakker | |
| 10,348,322 | B1 | 7/2019 | Jeong et al. | |
| 10,594,308 | B1 * | 3/2020 | Sun | H03M 1/0607 |
| 10,637,493 | B1 | 4/2020 | Geddada et al. | |

(Continued)

OTHER PUBLICATIONS

Tomohiko Ogawa, et al, "Non-binary SAR ADC with Digital Error Correction for Low Power Applications," 2010 IEEE Asia Pacific Conference on Circuits and Systems, pp. 196-199, Dec. 2010.

(Continued)

*Primary Examiner* — Peguy Jean Pierre
(74) *Attorney, Agent, or Firm* — Foley & Lardner LLP

(57) ABSTRACT

Systems and methods are related to device including but not limited to a SAR ADC. The device includes a first digital to analog conversion (DAC) circuit including first capacitors. The digital to analog conversion (DAC) circuit is configured to adjust a first input voltage in response to a first control signal. The device also includes a first comparator configured to receive an adjusted input voltage from the digital to analog conversion (DAC) circuit. The first control signal is provided in response to a target input voltage and a sensed input voltage and adjusts the first input voltage using the first capacitors.

20 Claims, 8 Drawing Sheets

(56) References Cited

U.S. PATENT DOCUMENTS

| | | | |
|---|---|---|---|
| 10,693,486 | B1 | 6/2020 | Ko |
| 10,812,098 | B1 | 10/2020 | Vishweshwara et al. |
| 10,862,496 | B1 | 12/2020 | Neto |
| 10,886,937 | B1 | 1/2021 | Bandyopadhyay et al. |
| 10,903,846 | B1 | 1/2021 | Liu et al. |
| 11,043,958 | B2 | 6/2021 | Lin et al. |
| 11,387,838 | B1 | 7/2022 | Dyer et al. |
| 11,476,868 | B2 | 10/2022 | Tangirala |
| 2010/0013690 | A1 | 1/2010 | Kuramochi et al. |
| 2011/0018605 | A1 | 1/2011 | Cho et al. |
| 2013/0051501 | A1 | 2/2013 | Furuta |
| 2013/0285844 | A1 | 10/2013 | Lin et al. |
| 2014/0022105 | A1 | 1/2014 | Chen et al. |
| 2014/0210653 | A1 | 7/2014 | Harpe |
| 2015/0091746 | A1 | 4/2015 | Wang |
| 2016/0094239 | A1 | 3/2016 | Fujiwara et al. |
| 2017/0201268 | A1 | 7/2017 | Sharma et al. |
| 2017/0359081 | A1 | 12/2017 | Chen et al. |
| 2019/0074845 | A1 | 3/2019 | Nakamura et al. |
| 2019/0131997 | A1 | 5/2019 | Liu et al. |
| 2019/0166325 | A1 | 5/2019 | Kim |
| 2023/0026315 | A1 | 1/2023 | Shrivastava |

OTHER PUBLICATIONS

Vito Giannini, "An 820uW 9b 40MS/s Noise-Tolerant Dynamic-SAR ADC in 90nm Digital CMOS," IEEE Solid-State Circuits Conference, pp. 237-238, 2008.

H. Park et al., "A 4.63pJ/b 112Gb/s DSP-Based PAM-4 Transceiver for a Large-Scale Switch in 5nm FinFET," 2023 IEEE International Solid-State Circuits Conference (ISSCC), San Francisco, CA, USA, 2023, pp. 110-112, doi: 10.1109/ISSCC42615.2023.10067613.

T. Ali et al., "6.4 A 180mW 56Gb/s DSP-Based Transceiver for High Density IOs in Data Center Switches in 7nm FinFET Technology," 2019 IEEE International Solid-State Circuits Conference—(ISSCC), San Francisco, CA, USA, 2019, pp. 118-120, doi: 10.1109/ISSCC.2019.8662523.

* cited by examiner

SUCCESSIVE APPROXIMATION REGISTER ANALOG TO DIGITAL CONVERTER WITH COMPARATOR PERFORMANCE CALIBRATION

CROSS REFERENCE TO RELATED PATENT APPLICATIONS

This application is related to U.S. patent application Ser. No. 18/522,698, filed Nov. 29, 2023.

FIELD OF THE DISCLOSURE

This disclosure generally relates to a communication system, including but not limited to a communication system including a successive approximation register analog to digital converter (SAR ADC).

BACKGROUND OF THE DISCLOSURE

Recent developments in communication and computing devices demand high data rates. For example, network switches, routers, hubs or any communication devices may exchange data at a high speed (e.g., 1 Mbps to 100 Gbps) to stream data in real time or process a large amount of data in a seamless manner. To process data efficiently in the digital domain, an amplitude or a voltage of a signal may be represented by multiple bits, and the signal may be exchanged between two or more communication devices through a cable or a wireless medium. For example, 1.2 V of a signal may be represented as a byte (B) such as 00010110, and 1.3 V of the signal may be represented as a B such as 00011001. To convert a voltage of an input signal into corresponding bits, some communication devices implement a SAR ADC. For example, the SAR ADC may determine a number of bits corresponding to the input signal through successive approximation. Process, voltage, and temperature (PVT) variations can affect the speed, precision and/or accuracy of SAR ADCs.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
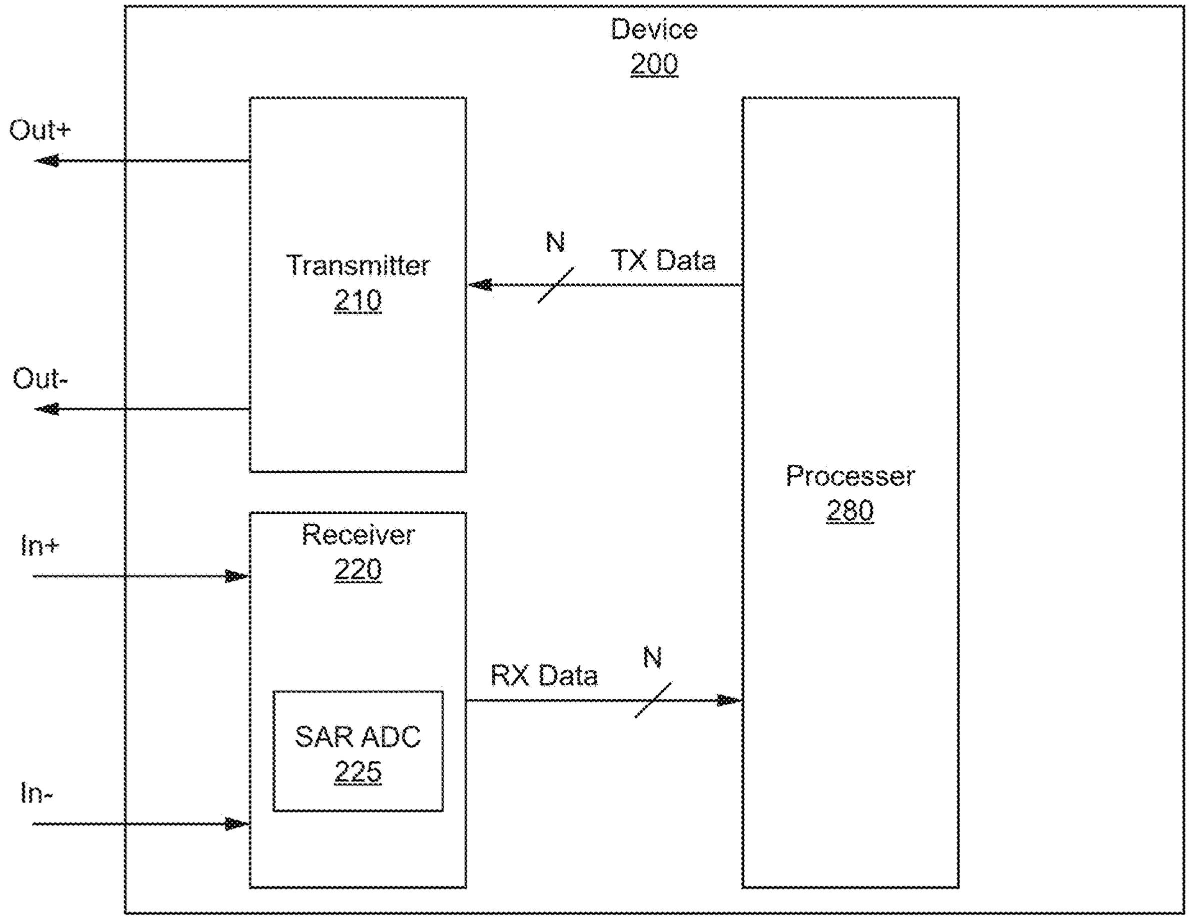
FIG. 1 is a general block diagram depicting a communication device, according to one or more embodiments.

The details of various embodiments of the methods and systems are set forth in the accompanying drawings and the description below.

DETAILED DESCRIPTION

Systems and methods for calibration of a SAR ADC are described below, according to one or more embodiments. Various embodiments disclosed herein are related to a device for communication of data. In some embodiments, the device includes or is a SAR ADC employed in a physical layer product. In some embodiments, the SAR ADC is a high speed SAR ADC (e.g., with resolutions at and beyond 7 and speeds of several hundred Mega samples per second operating frequency). In some embodiments, the SAR ADC is adaptively tuned for PVT operations to increase speed or reduce noise as appropriate. The adaptive feedback technique can increase the speed of operation in the slow corner without any common mode voltage $V_{CM}$ related performance degradation in the fast (FF) corner in some embodiments. Advantageously, systems and methods described herein can provide a SAR ADC that has reduced latency and reduced noise over variations in process, voltage and temperature (PVT) and input common mode voltage $V_{cm}$.

In some embodiments, a time interleaved successive approximation register analog to digital converter (TI SAR ADC) contains multi-way interleaved sub-ADCs and is a major building block in an ADC/DSP based Serializer/Deserializer (SerDes) core. In some embodiments, performance issues associated with a latched based comparator of the ADC that effect the power, noise and speed of the entire ADC are mitigated. The performance issues can be due to PVT variations and input common mode voltage ($V_{cm}$) bias conditions. The performance issues can be magnified in a networking switch chip due to huge global and local variations among hundreds of lanes distributed over large chip area. In some embodiments, performance issues are mitigated by having a well-controlled bias current ($I_{bias}$) for the comparator and addressing variances due to input common mode voltage $V_{cm}$ being determined by the previous driving stage. In some embodiments, the systems and methods address the worst variability caused by PVT variations in order to meet the timing and noise specifications. In some embodiments, the SAR ADC is configured to meet timing specification for fast and slow corner PVT variations. In some embodiments, the ADC is configured so the clocking transistor has enough headroom, and the speed is not degraded due to insufficient bias current while maintaining sufficient noise-based performance degradation.

In some embodiments, the ADC includes a comparator topology and calibration scheme configured to reduce the performance issues described above. In some embodiments, systems and methods provide calibration without degrading driving stage performance and optimize the comparator common mode voltage $V_{cm}$ without affecting other stages.

Various embodiments disclosed herein are related to an apparatus including a receiver. The apparatus can be used in communication applications. The receiver includes an analog-to-digital conversion (ADC) circuit including a comparator and a processor. The processor is configured to perform comparator current bias calibration and/or input common mode voltage $V_{cm}$ calibration.

Some embodiments relate to a device including but not limited to a SAR ADC. The device includes a first digital to analog conversion (DAC) circuit including first capacitors. The digital to analog conversion (DAC) circuit is configured to adjust a first input voltage in response to a first control signal. The device also includes a first comparator configured to receive an adjusted input voltage from the digital to analog conversion (DAC) circuit. The first control signal is provided in response to a target input voltage and a sensed input voltage and adjusts the first input voltage using the first capacitors.

A digital to analog conversion (DAC) circuit can refer to any circuit that converts a binary input number into an analog output in some embodiments. A DAC circuit can be a capacitive sample and hold DAC circuit for an ADC in some embodiments. An adjusted input voltage refers to a signal that has been changed for modified from its original input. The adjusted voltage signal can be adjusted in accordance with a calibration scheme in some embodiments. A control signal can refer to any signal (digital or analog) that causes a component or circuit to provide an action in some embodiments. A target input voltage can refer to a desired signal in some embodiments. A sensed input voltage can refer to a signal that reflects an actual signal or characteristic occurring or that has occurred in a circuit or component in some embodiments. A comparator can refer to any circuit that can compare two signals and provide an output representative of a characteristic of the comparison. A comparator can be embodied as a differential circuit or operational amplifier in some embodiments.

In some embodiments, the sensed input voltage is provided by a replica circuit. A replica circuit can refer to a circuit that is similar to another circuit or component for providing a copy or replica of a parameter, signal, or operation associated with the another circuit in some embodiments. In some embodiments, the replica circuit comprises an input filter, an output filter, and a replica DAC circuit corresponding to the first digital to analog conversion (DAC) circuit coupled between the input filter and the output filter. In some embodiments, the replica circuit further comprises a replica comparator and second capacitors configured by the first control signal.

In some embodiments, the device also includes a current source configured to control a bias current for the first comparator. The current source is controlled by a second control signal which is provided in response to a conversion margin. A current source can refer to any circuit for providing a current in some embodiments. A bias current can refer to a current flowing into or out of a component or circuit for operation of the component or circuit in some embodiments.

In some embodiments, the device also includes a current source configured to provide a bias current for the first comparator. The current source is controlled by a second control signal which is provided in response to a conversion margin. The first comparator further includes a differential pair of transistors and a first transistor configured to receive a clock signal for enabling the first comparator. The first transistor is coupled between the differential pair and the current source. A differential pair of transistors can refer to two transistors coupled together at a terminal and configured to provide a signal at the terminal in some embodiments. A differential pair can be two well matched, source-coupled or drain coupled transistors and can be used in a differential amplifier configuration in some embodiments. A clock signal can refer to any signal that oscillates between a high and low state in some embodiments. A clock signal can be used to coordinate a sequence of actions in a circuit. A clock signal can be a square wave signal, a sinusoidal signal, a trapezoidal signal, etc.

In some embodiments, the first control signal controls switches coupled to respective capacitors of the first capacitors. In some embodiments, the device further includes DAC units. Each of the DAC units includes a second circuit configured to determine a conversion margin in a unit of the second circuit. In some embodiments, the first input voltage is an input common mode voltage. An input common mode voltage can refer to the voltage of an input signal provided to a circuit in some embodiments. The common mode voltage is a component of differential input signals taken together in some embodiments.

Some embodiments relate to a device including a number of units. Each unit includes a first digital to analog conversion (DAC) circuit, a first comparator configured to receive an input voltage from the digital to analog conversion (DAC) circuit, and a current source configured to control a bias current for the first comparator. The current source is controlled by a first control signal which is provided in response to a conversion margin for the unit.

In some embodiments, the first digital to analog conversion (DAC) circuit includes a first capacitors. The digital to analog conversion (DAC) circuit is configured to adjust a first input voltage in response to a second control signal. The first comparator is configured to receive an adjusted input voltage from the digital to analog conversion (DAC) circuit. The second control signal is provided in response to a target input voltage and a sensed input voltage and adjusts the first input voltage using the capacitors.

In some embodiments, the input voltage is an input common mode voltage. In some embodiments, the sensed input voltage is provided by a replica circuit. The replica circuit includes an input filter, an output filter and a replica DAC circuit corresponding to the first digital to analog conversion (DAC) circuit coupled between the input filter and the output filter. In some embodiments, the replica circuit further includes a replica comparator and second capacitors configured by the second control signal. In some embodiments, the first comparator further includes a differential pair of transistors and a first transistor configured to receive a clock signal for enabling the first comparator. The first transistor is coupled between the differential pair and the current source and each of the units includes a first circuit configured to determine the conversion margin in the unit of the first circuit.

Some embodiments relate to an analog-to-digital conversion device including a number of units. Each unit includes a first digital to analog conversion (DAC) circuit including capacitors. The digital to analog conversion (DAC) circuit is configured to adjust a first input voltage in response to a first control signal. Each unit also includes a first comparator configured to receive an adjusted input voltage from the digital to analog conversion (DAC) circuit. The first control signal is provided in response to a target input voltage and a sensed input voltage and adjusts the first input voltage using the capacitors.

In some embodiments, the device also includes a current source configured to control a bias current for the first comparator. The current source is controlled by a second control signal which is provided in response to a conversion margin.

In some embodiments, the device also include a current source configured to provide a bias current for the first comparator. The current source is controlled by a second control signal which is provided in response to a conversion margin. The first comparator further includes a differential pair of transistors and a first transistor configured to receive a clock signal for enabling the first comparator. The first transistor is coupled between the differential pair and the current source.

In some embodiments, the first control signal controls switches coupled to respective capacitors of the capacitors. In some embodiments, the first input voltage is an input common mode voltage.

Various embodiments disclosed herein are related to a SAR ADC, such as, a high speed SAR ADC or very high speed SAR ADC. In some embodiments, the SAR ADC is relatively immune to PVT variations and is configured for use in 200G/100G networking applications. In some embodiments, the systems and methods described herein for a SAR ADC are used in network integrated circuits (ICs) such as an optical transceiver or other transceiver. In some embodiments, the systems and methods described herein provide a speed and lower noise advantage without a significant power/area penalty. The SAR ADC can be utilized in or communicate with the various components in a variety of communication environments. The SAR ADC can operate according to the principles described herein and use the conversion structure and operations described in U.S. Pat. No. 10,903,846 assigned to the assignee of the present application and incorporated herein by reference in its entirety. The SAR ADC can operate according to the principles described herein and use the conversion structure and operations described in U.S. patent application Ser. No. 18/522,698, U.S. patent application Ser. No. 17/700,166, and U.S. patent application Ser. No. 17/694,225, all assigned to the assignee of the present application and incorporated herein by reference in their entireties. In some embodiments, a calibration circuit is provided for a comparator in a TI SAR ADC to achieve optimal performance under variations in PVT and input common mode voltage $V_{cm}$.

FIG. 1 is a block diagram depicting a communication device 200, according to one or more embodiments. In some embodiments, the communication device 200 is a system, a device, or an apparatus for network communications. For example, the communication device 200 is implemented as part of the network device, node, or network component. In some embodiments, the device 200 includes a transmitter 210, a receiver 220, and a processor 280. These components may operate together to communicate with another communication device through a network cable (e.g., Ethernet, USB, Firewire, etc.) and/or through a wireless medium (e.g., Wi-Fi, Bluetooth, 60 GHz link, cellular network, etc.). In some embodiments, the communication device 200 includes more, fewer, or different components than shown in FIG. 1.

The transmitter 210 is a circuit or a component that receives transmit data TX Data from the processor 280, and generates output signals Out+, Out−. The transmitter 210 may receive N bits of digital data TX Data from the processor 280, and generate the output signals Out+, Out− having voltages or currents corresponding to the digital data TX Data. The output signals Out+, Out− may be differential signals. In some embodiments, the transmitter 210 may generate a single ended signal or a signal in a different representation for the output signals Out+, Out−. In some embodiments, the transmitter 210 transmits the output signals Out+, Out− through a network cable. In some embodiments, the transmitter 210 provides the output signals Out+, Out− to a wireless transmitter (not shown) that can upconvert the output signals Out+, Out− to generate a wireless transmit signal at a radio frequency and transmit the wireless transmit signal through a wireless medium.

The receiver 220 is a circuit or a component that receives input signals In+, In−, and generates receive data RX Data. In some embodiments, the receiver 220 receives the input signals In+, In− through a network cable. The input signals In+, In− may be differential signals. In some embodiments, the receiver 220 may receive a single ended signal or a signal in a different representation for the input signals In+, In−. In some embodiments, the receiver 220 receives the input signals In+, In− from a wireless receiver (not shown) that can receive a wireless receive signal through a wireless medium and down convert the wireless receive signal to generate the input signals In+, In− at a baseband frequency. In some embodiments, the receiver 220 receives the input signals In+, In− and generates N bits of digital data RX Data corresponding to voltages or currents of the input signals In+, In−. The receiver 220 may provide the digital data RX Data to the processor 280. In some embodiments, the receiver 220 includes a SAR ADC 225 that can convert the input signals In+, In− into N-bit digital data RX Data.

The processor 280 is a circuit or a component that can perform logic computations. In some embodiments, the processor 280 is implemented as a field-programmable gate array, an application-specific integrated circuit, or state machine. The processor 280 may be electrically coupled to the transmitter 210 and the receiver 220 through conductive traces or bus connections. In this configuration, the processor 280 may receive the data RX Data from the receiver 220 and perform logic computations or execute various applications according to states of the received data RX Data. The processor 280 may also generate the data TX Data, and provide the data TX Data to the transmitter 210.

Figure 2:
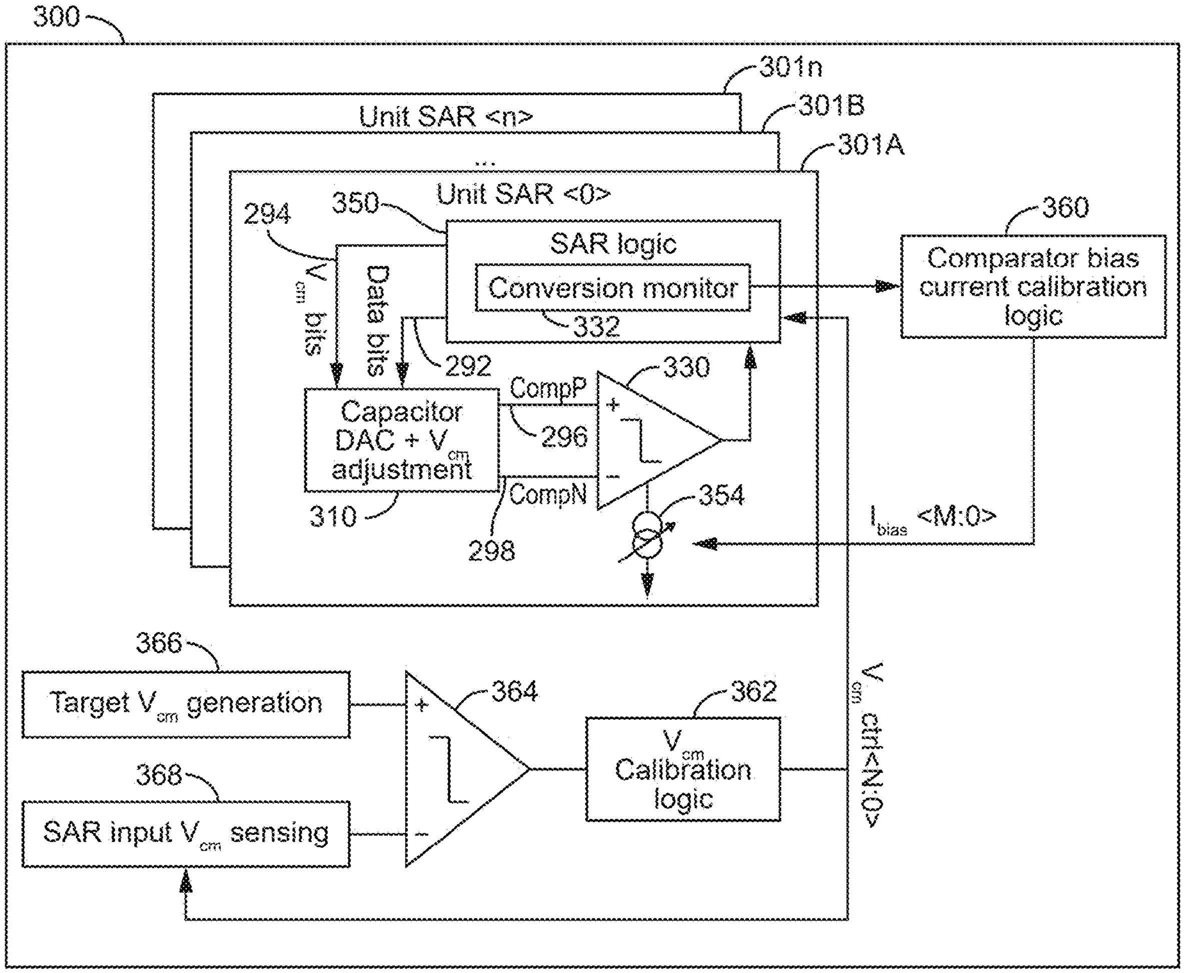
FIG. 2 is a schematic block diagram of a SAR ADC capable of being used in the communication device illustrated in FIG. 1, according to one or more embodiments.

With reference to FIG. 2, a SAR ADC 300 may be implemented as SAR ADC 225 illustrated in FIG. 1. In some embodiments, SAR ADC 300 includes a number of SAR units, such as SAR unit 301A, SAR unit 301B, . . . . SAR unit 301*n*. SAR ADC 300 can include any number of SAR units, (e.g., n units, where n is 1 or more more). SAR unit 301A is similar or identical to SAR unit 301B, . . . , and SAR unit 301*n* in some embodiments. In some embodiments, SAR unit 301A includes a sample capacitor and digital to analog converter (CAPDAC) circuit 310, a comparator circuit 330, and a SAR logic circuit 350. SAR logic circuit 350 includes a conversion margin monitor circuit 332. In some embodiments, SAR ADC 300 also includes a comparator bias current calibration circuit 360, a common mode voltage $V_{cm}$ calibration logic circuit 362, a comparator 364, a target input common mode voltage $V_{cm}$ generation circuit 366, and a SAR input common mode voltage $V_{cm}$ sensing circuit 368. In some embodiments, the SAR ADC 300 includes more, fewer, or different components than shown in FIG. 2. Additional comparator circuits and storage circuits can be provided in a cascaded, pipelined or serial fashion (e.g., a two comparator design for SAR ADC 300). SAR ADC 300 is an IC device integrated on a single substrate, provided in a multi-chip package, or is part of another IC device in some embodiments.

In some embodiments, sample and DAC circuit 310 is a circuit or a component that samples the input signals In+, In−, and generates DAC output signals CompP, CompN at nodes 296 and 298. In some embodiments, the sample and DAC circuit 310 is embodied as a capacitive DAC circuit. In some embodiments, the sample and DAC circuit 310 includes inputs configured to receive the input signals In+, In−, feedback ports configured to receive data bits and common mode voltage bits $V_{cm}$ from SAR logic circuit 350 at nodes 292 and 294, and output ports configured to output DAC output signals CompP, CompN to comparator circuit 330. In some embodiments, sample and DAC circuit 310 includes dedicated capacitors for adjusting the common mode input voltage $V_{cm}$. The common mode input voltage $V_{cm}$ can refer to the average voltage level of the differential input signals for SAR ADC 300 in some embodiments. The common mode input voltage $V_{cm}$ can be equal to the sum of the signals In+ and In− divided by 2 in some embodiments.

In some embodiments, comparator circuit 330 is a circuit or a component that receives the DAC output signals CompP, CompN, and determines a state of a corresponding bit of the data RX Data according to the DAC output signals CompP, CompN. In some embodiments, the comparator circuit 330 includes a first output port coupled to first input ports of the first set of storage circuits, and a second output port coupled to input ports of the second set of storage circuits.

Comparator circuit 330 may be enabled or disabled according to the clock signal CLK_SAR. The clock signal CLK_SAR is a comparator clock signal for the comparator circuit 330. For example, comparator circuit 330 is enabled in response to a rising edge or logic state '1' of the clock signal CLK_SAR and is disabled in response to a falling edge or logic state '0' of the clock signal CLK_SAR. When the comparator circuit 330 is enabled, the comparator circuit 330 may determine a state of a bit according to the DAC output signals CompP, CompN, and generate comparator outputs indicating the determined state of the bit. For example, when the comparator circuit 330 is enabled, in response to a difference in voltages of the DAC output signal CompP, CompN being higher than OV or a reference voltage, the comparator circuit 330 may generate a comparator output a logic state '1'. For example, when the comparator circuit 330 is enabled, in response to a difference in voltages of the DAC output signals CompP, CompN being lower than OV or the reference voltage, the comparator circuit 330 may generate the comparator output having a logic state '0'. When the comparator circuit 330 is disabled, the comparator circuit 330 may reset the comparator output to logic state '0'. The comparator output is a differential signal in some embodiments.

Comparator circuit 330 is advantageously coupled to current source 354 (e.g., variable current source) which is controlled by a control signal from comparator bias current calibration circuit 360. Current source 354 provides a directly controlled bias current $I_{bias}$ for comparator circuit 330. A magnitude of the bias current $I_{bias}$ is related to the control signal (e.g., $I_{bias}$ bits M:0), where M is an integer (e.g., 3). The control signal (e.g., $I_{bias}$ bits M:0) controls a magnitude of the bias signal to reduce performance issues associated with conventional comparator circuits. For example, controlling the bias current reduces susceptibility of comparator performance with variations in PVT and common mode bias conditions.

SAR logic circuit 350 is coupled to common mode voltage $V_{cm}$ calibration logic circuit 362, comparator circuit 330, comparator bias current calibration circuit 360, and sample and DAC circuit 310. SAR logic circuit 350 is configured to receive the comparator output and provide the data bits to sample and DAC circuit 310 and the input common mode voltage $V_{cm}$ voltage bits to sample and DAC circuit 310. SAR logic circuit 350 is configured to operate iteratively to determine each bit of the digital output code. SAR logic circuit 350 can initialize the conversion process by setting up sample and DAC circuit 310 to output an initial guess for the most significant bit (MSB) of the digital code and analyze a comparison of the output of sample and DAC circuit 310 with the input analog signal. Based on the comparison result, SAR logic circuit 350 adjusts the output for the next bit in the digital code. After setting each bit, the SAR logic circuit 350 provides feedback (e.g., via data bits to sample and DAC circuit 310) and input common mode voltage $V_{cm}$ (e.g., a control signal) to sample and DAC circuit 310 in some embodiments.

SAR logic circuit 350 includes conversion margin monitor circuit 332 which is configured to determine parameters associated with the conversion operation for SAR ADC 300. In some embodiments, conversion margin monitor circuit 332 is configured to provide a feedback signal to comparator bias current calibration circuit 360 which provides the $I_{bias}$ bits in response to the feedback. In some embodiments, conversion margin monitor circuit 332 provides conversion margin bits associated with the amount of conversion margin and provides those bits as the feedback to comparator bias current calibration circuit 360. In some embodiments, the conversion margin is indicative of an amount of unused time before a bit error occurs within a sampling cycle. The conversion margin can be determined from comparator output transitions and clock signals in some embodiments.

In some embodiments, one or more of conversion margin monitor circuit 332, comparator bias current calibration circuit 360, and common mode voltage $V_{cm}$ calibration logic circuit 362 is an on-chip controller configured to determine the conversion margin and adjust parameters to achieve faster operation and/or less noise. Advantageously, the controller implements systems and methods described herein for determining conversion margin and adjusting parameters (e.g., via input common mode voltage $V_{cm}$ control bits [N:0] and the control signal ($I_{bias}$ bits M:0)) in some embodiments. The controller can be a hardware implementation or software (e.g., firmware implementation) integrated with SAR ADC 300. In some embodiments, one or more of conversion margin monitor circuit 332, comparator bias current calibration circuit 360, and common mode voltage $V_{cm}$ calibration logic circuit 362 is a processor, microcontroller, an application specific integrated circuit (ASIC), a field programmable gate array (FPGA) or logic device, or any other type and form of dedicated semiconductor logic or processing circuitry capable of processing or supporting the operations described herein.

In some embodiments, input common mode voltage $V_{cm}$ calibration logic circuit 362 is similar to SAR logic circuit 350 and/or conversion margin monitor circuit 332. In some embodiments, input common mode voltage $V_{cm}$ calibration logic circuit 362 is coupled to SAR logic circuit 350 and SAR input common mode voltage $V_{cm}$ sensing circuit 368. Input common mode voltage $V_{cm}$ calibration logic circuit 362 is configured to provide input common mode voltage $V_{cm}$ control bits [N:0] to SAR input common mode voltage $V_{cm}$ sensing circuit 368 and SAR logic circuit 350 where N is an integer. Input common mode voltage $V_{cm}$ calibration logic circuit 362 is configured to provide input common mode voltage $V_{cm}$ control bits [N:0] in response to an output from comparator 364 as discussed below in some embodiments. Comparator 364 provides a signal associated with a comparison of a target input common mode voltage $V_{cm}$ (e.g., a desired voltage) from target input common mode voltage generation circuit and SAR input and a sensed input common mode voltage $V_{cm}$ from input common mode voltage $V_{cm}$ sensing circuit 368 in some embodiments. SAR input common mode voltage $V_{cm}$ sensing circuit 368 determines sensed input common mode voltage $V_{cm}$ at an input of comparator circuit 330.

Figure 3:
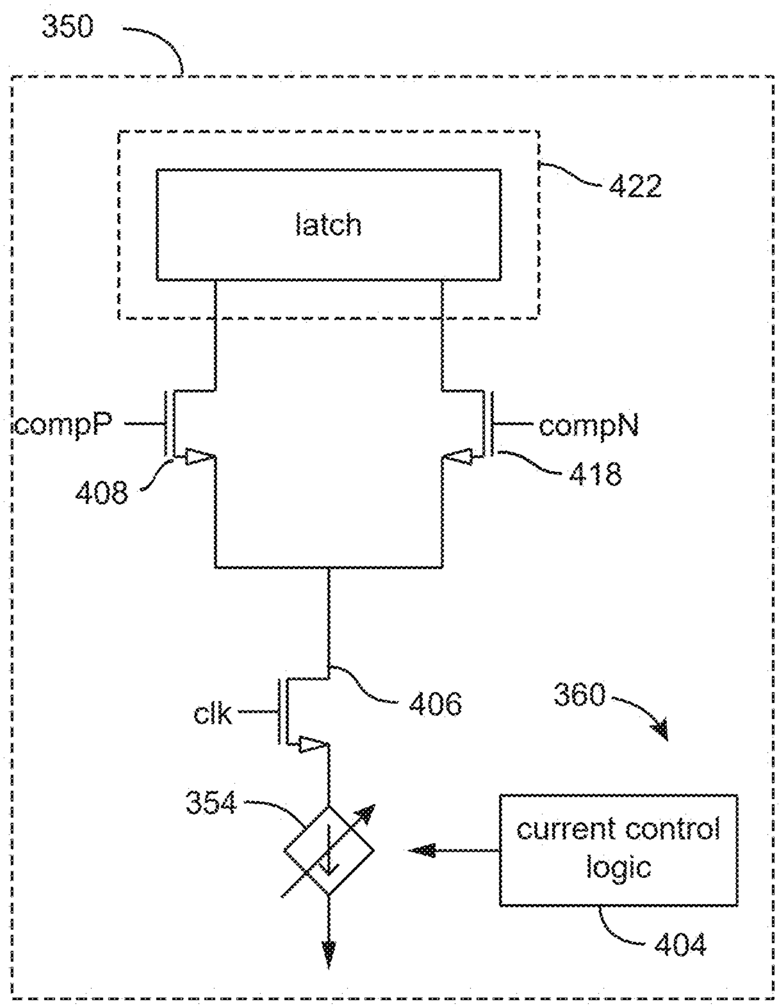
FIG. 3 is a schematic diagram of a comparator circuit for the SAR ADC illustrated in FIG. 2, according to one or more embodiments.

With reference to FIG. 3, comparator circuit 330 includes a latch 422, a transistor 408 for receiving the compP signal, a transistor 418 for receiving the CompP signal, and a transistor 406 for receiving a clock signal (e.g., CLK_SAR). Transistor 406 is coupled to current source 354 which is a variable current source controlled by comparator bias current calibration circuit 360. Current control logic 404 within comparator bias current calibration circuit 360 is configured to provide a control signal ($I_{bias}$ bits [M:0]) in response to the conversion margin as explained below in some embodiments. The comparator bias current can refer to current flowing into or out of the differential input pair of transistors of comparator circuit 330 (e.g., transistors 408 and 418) in some embodiments. The comparator bias current is a DC current $I_{bias}$ in some embodiments.

Noise and delay are sensitive to comparator bias current $I_{bias}$. The delay T_delay is approximately related to $1/I_{bias}$ in some embodiments. The noise is approximately related to the the square root of $I_{bias}$ in some embodiments. The use of a programmable current source 354 below transistor 406 for the clock signal, makes the performance of SAR ADC 300 robust to PVT variations in some embodiments. The comparator bias current $I_{bias}$ is calibrated using SAR conversion timing margin information which reduces the noise as much as possible under the conversion timing constraint in some embodiments. The conversion margin monitor circuit 332 (FIG. 2) provides the conversion margin and/or other conversion timing information in some embodiments.

Figure 4:
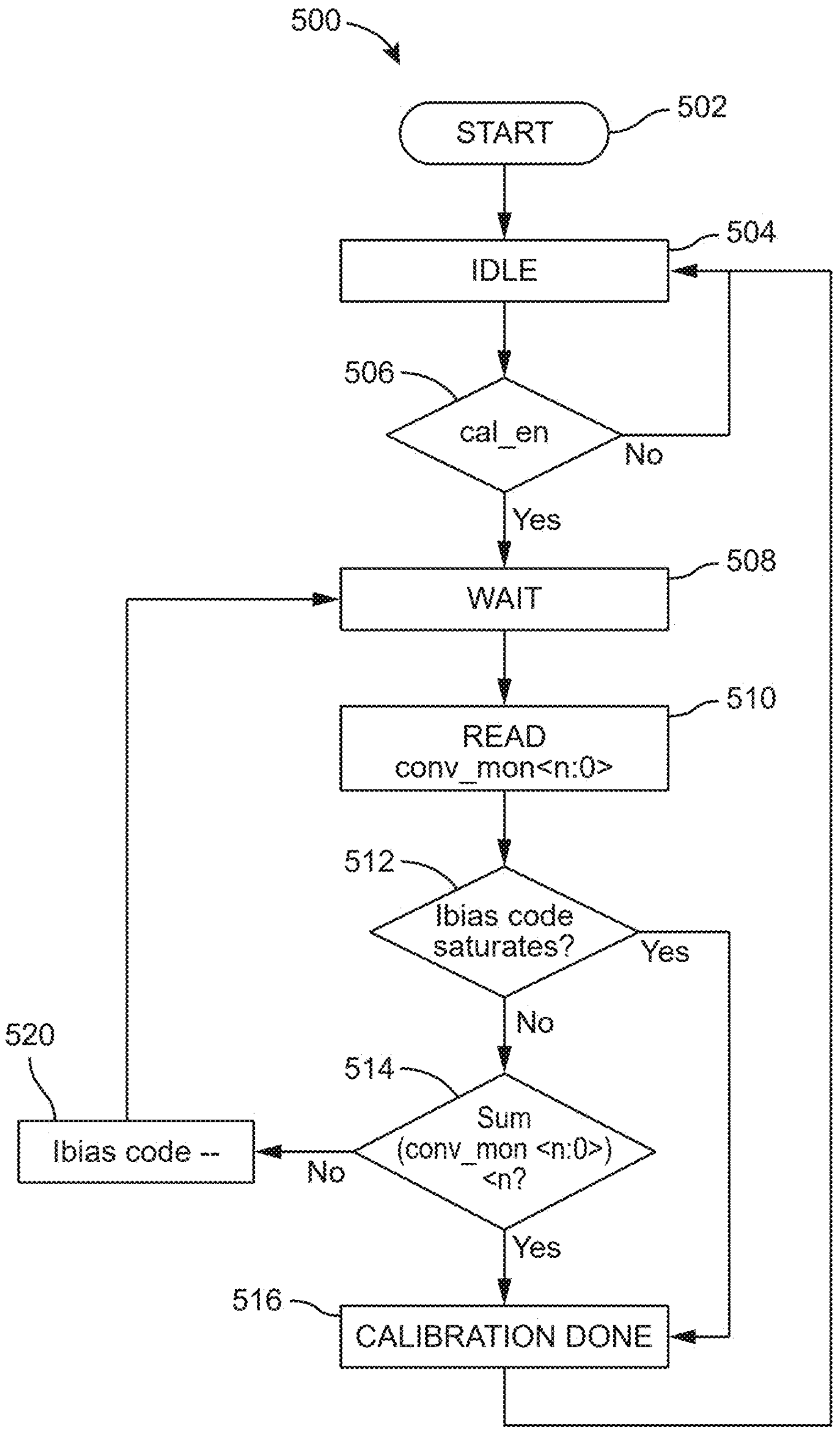
FIG. 4 is a flow diagram showing comparator bias current calibration operations for the SAR ADC illustrated in FIG. 2, according to one or more embodiments.

With reference to FIGS. 2 and 4, SAR ADC 300 can perform a flow 500 to calibrate comparator bias current $I_{bias}$. Flow 500 determines the $I_{bias}$ bits [M:0] or other signals or code for the best or better noise performance while meeting the timing requirements in some embodiments. Flow 500 can run in both foreground and background and can run with or without data traffic. At an operation 502, an initial state, $I_{bias}$ bits [M:0] is set at the maximum code which sets comparator at the maximum speed. At an operation 502, flow 500 is idle. At an operation 506, flow determines if calibration is enabled in response to a calibration enable signal cal_en. If enabled SAR ADC 300 waits a certain time T for the comparator bias current $I_{bias}$ to settle at an operation 508. If not enabled, SAR ADC 300 returns to operation 504.

After time T associated with operation 508, the comparator bias current settles and the outputs of every SAR conversion margin monitor circuit 332 in units 301A, 301B, . . . 301*n* are captured by SAR logic circuit 350 in operation 510. The outputs reflect the conversion margin for each of units 301A, 301B, . . . 301*n*.

After operation 510, SAR ADC 300 determines if the $I_{bias}$ bits [M:0] have saturated (e.g., reaches the limit for current adjustment range). If so, flow 500 advances to an operation 516 and the calibration is complete. If not, SAR ADC 300 advances to operation 514, where the outputs of every SAR conversion margin monitor circuit 332 in units 301A, 301B, . . . 301*n* is determined and summed. If the outputs indicate that all units 301A, 301B, . . . 301*n* have enough conversion timing margin, then the $I_{bias}$ code is reduced in operation 520. If the outputs indicate all units 301A, 301B, . . . 301*n* do not have enough conversion timing margin, then flow 500 advances to an operation 516 and the calibration is complete. After operation 520, flow 500 returns to operation 508 and operations 510, 512, and 514 are repeated process until the sum indicates not all units 301A, 301B, . . . 301*n* have conversion margin and the calibration is complete. In some embodiments, the control signal is set to the level before the last decrease when the calibration is done at operation 516. After operation 516, flow 500 returns to operation 504.

Figure 5:
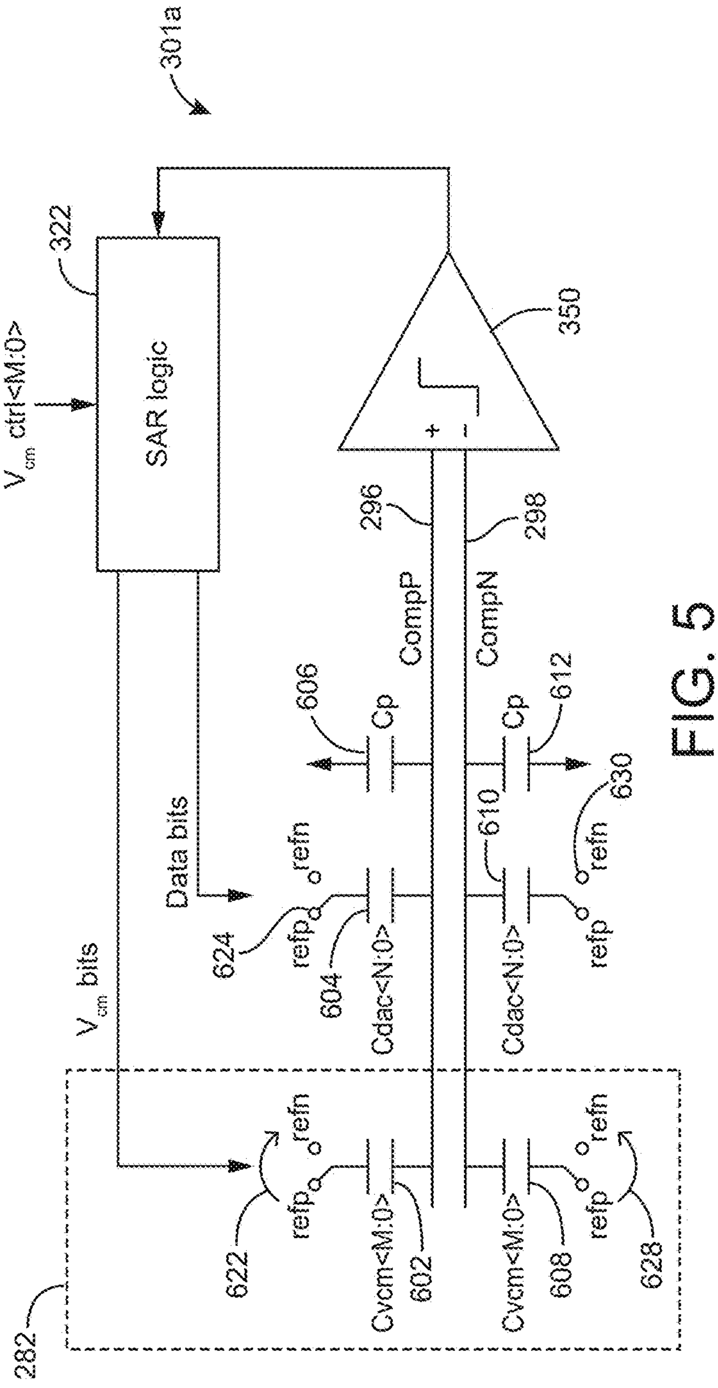
FIG. 5 is a more detailed schematic block diagram of a SAR unit of the SAR ADC illustrated in FIG. 2, according to one or more embodiments.

With reference to FIG. 5, inputs of comparator circuit 330 are coupled to capacitors 602, 604, 606, 608 and 612 in some embodiments. Circuit 282 includes capacitor 602 coupled to switch 622 and capacitor 608 is coupled to switch 628 for input common mode voltage $V_{cm}$ adjustments. Capacitor 604 coupled to switch 624, and capacitor 610 is coupled to switch 630. Switches 622 and 628 are controlled by input common mode voltage $V_{cm}$ bits from SAR logic circuit 322, and switches 624 and 630 are controlled by data bits from SAR logic circuit 322. In some embodiments, adjustment to input common mode voltage $V_{cm}$ is implemented within sample and DAC circuit 310 using capacitors 602 and 608. Capacitors 602 and 608 represent multiple dedicated $V_{cm}$ cap units [N:0] in some embodiments. The adjustment is realized by switching the bottom plate connection of capacitors 602 and 608 from $V_{refp}$ to $V_{refn}$ to decrease input common mode voltage $V_{cm}$, or from $V_{refn}$ to $V_{refp}$ to increase input common mode voltage $V_{cm}$. The adjustment amount and direction is controlled by the input common mode voltage $V_{cm}$ bits. The absolute value of $\Delta V_{cm}$ can be calculated by the following equation:

$$\Delta V_{cm} = (V_{refp} - V_{refn}) \cdot C_{vcm}/C_{total}$$

where $C_{vcm}$ is the total capacitance being switched by the input common mode voltage $V_{cm}$ bits, and $C_{total}$ is the sum of capacitance of capacitors 602, 604 and 606, or capacitors 608, 610 and 612.

The two sums are equal in some embodiments. The factor $\Delta V_{cm}$ can be directly coupled to the comparator input for performance adjustment purposes in some embodiments. Capacitors 604 and 610 provide the regular SAR conversion function by applying a differential voltage at the comparator inputs in some embodiments. Capacitors 606 and 612 have a fixed connection at their bottom plates in some embodiments. Capacitors 604 and 610 represent multiple dedicated $V_{cm}$ cap units in some embodiments.

Figure 6:
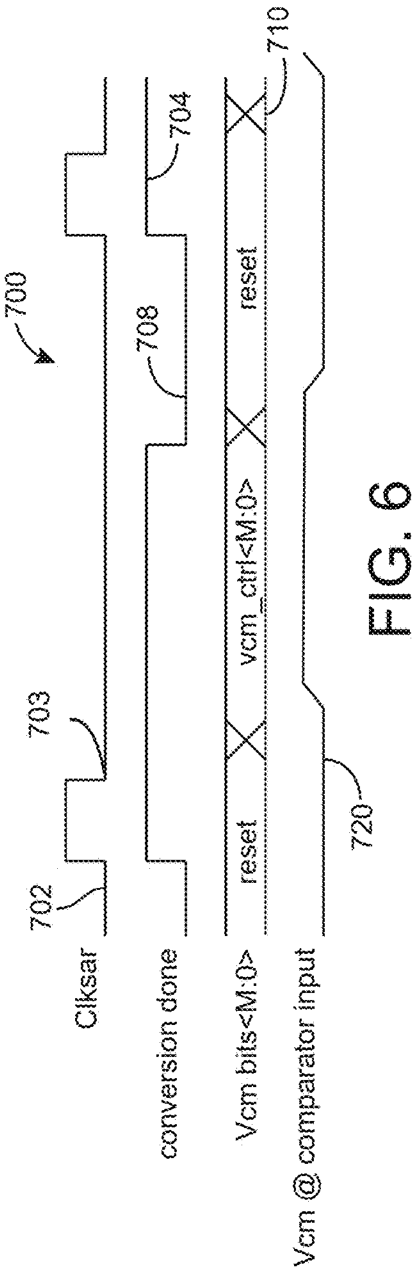
FIG. 6 is a timing diagram showing provision of input common mode voltage Vem bits provided by the SAR logic circuit of the SAR ADC illustrated in FIG. 2, according to one or more embodiments.

With reference to FIG. 6, a wave form diagram 700 includes a clock signal 702 (e.g., SAR CLK), a conversion done signal 704 indicative of a conversion operation being complete, input common mode voltage $V_{cm}$ bits 710, and input common mode voltage $V_{cm}$ signal 720. In each SAR conversion cycle, input common mode voltage $V_{cm}$ bits 710 are set to the desired code after clock signal 702 sampling edge 703 is complete. Input common mode voltage $V_{cm}$ bits 710 are reset by the conversion done bit 708 of signal 704 which indicates the SAR conversion is finished within the current SAR cycle. Input common mode voltage $V_{cm}$ signal 708 is taken at the comparator input and occurs after the edge 703 of signal 702.

Figure 7:
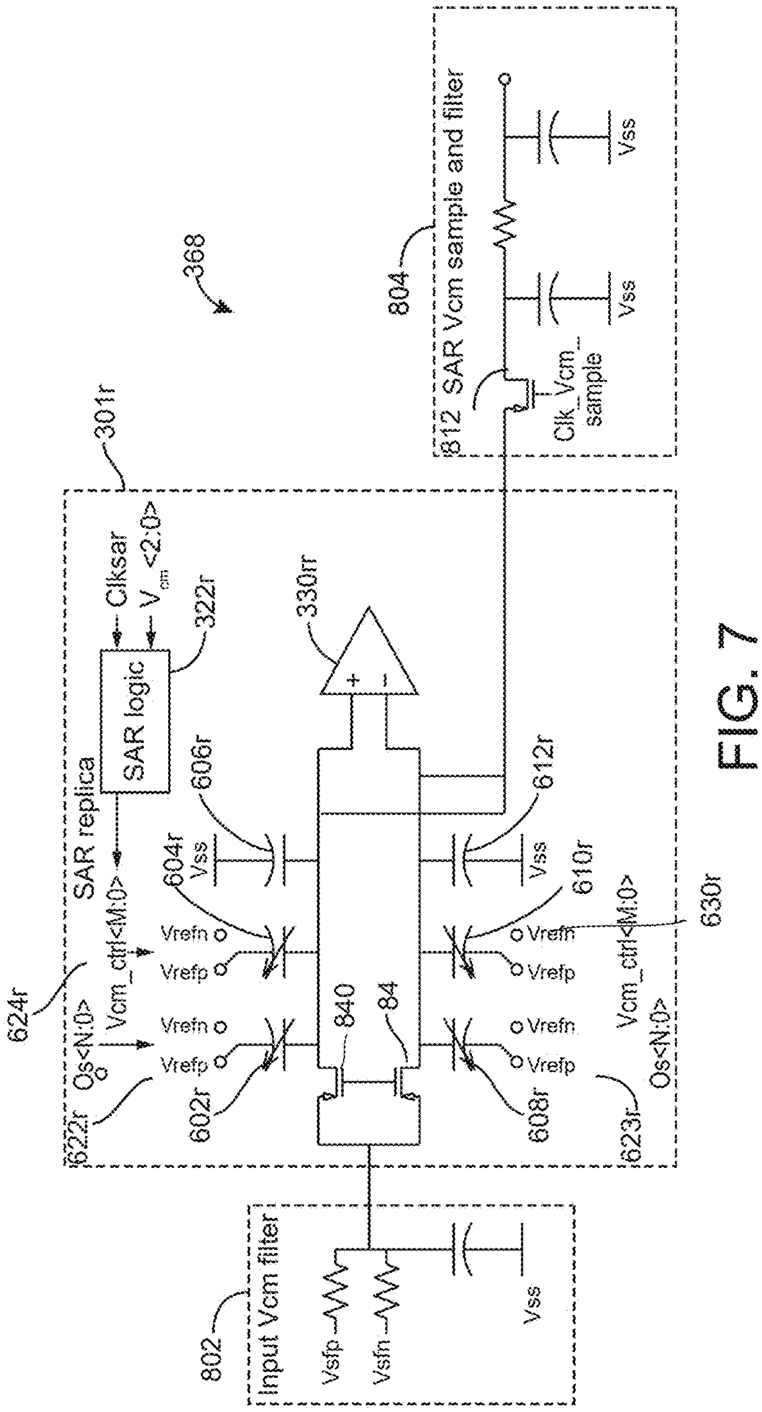
FIG. 7 is a more detailed schematic block diagram of an input common mode voltage Vem sensing circuit for the SAR ADC illustrated in FIG. 2, according to one or more embodiments.

With reference to FIG. 7, SAR input common mode voltage $V_{cm}$ sensing circuit 368 can be implemented using a replica scheme and filtering. Input common mode voltage $V_{cm}$ sensing circuit 368 includes a SAR replica unit 301*r*, an input common mode voltage $V_{cm}$ filter 802, a SAR common mode voltage $V_{cm}$ sample and filter circuit 804 in some embodiments. SAR replica unit 301*r* is similar to SAR unit 301A, SAR unit 301B, . . . , and SAR unit 301*n* in some embodiments. In some embodiments, SAR replica unit 301*r* includes a replica SAR logic circuit 322*r*, a replica sample capacitor and digital to analog converter (CAPDAC) circuit 310*r*, and a replica comparator circuit 354*r*. Replica SAR logic circuit 322*r* receives input common mode voltage $V_{cm}$ bits [2:0] and the clock signal and provides a replica input common mode voltage $V_{cm}$ bits [M:0]. Replica can refer to a component or circuit being similar to another circuit or component for providing a copy or replica of a parameter, signal, or operation associated with the another circuit or component in some embodiments.

Inputs of comparator circuit 330*r* are couped to capacitors 602*r*, 604*r*, 606*r*, 608*r* and 612*r* in some embodiments. Capacitor 602*r* is coupled to switch 622*r*. Capacitor 604*r* is coupled to switch 624*r*. Capacitor 608 is coupled to switch 628*r*. Switches 614*r* and 630*r* are controlled by replica input common mode voltage $V_{cm}$ bits from replica SAR logic circuit 322*r*, and switches 622*r* and 623*r* are controlled by bits $O_s$[N:0]. Capacitors 602*r*, 604*r*, 606*r*, 608*r* and 612*r* are variable capacitors in some embodiments.

In some embodiments, input common mode voltage $V_{cm}$ filter 802 includes a first resistor, a second resistor, and a capacitor. Filter 802 can be an RC filter employed before transistors 840 and 842 at an input of comparator circuit 330*r* and configured to extract input common mode voltage $V_{cm}$ and filter out high frequency components while keeping the DC component.

SAR replica unit 301*r* can be a modified version of SAR unit 301A where the SAR conversion is is disabled while keeping the sampling and input common mode voltage $V_{cm}$ and adjustment function. The voltage at the input of comparator circuit 330*r* reflects input common mode voltage $V_{cm}$ of the SAR ADC 300. The voltage is sampled by sample capacitor and digital to analog (CAPDAC) circuit 310*r* and filtered by SAR common mode voltage $V_{cm}$ sample and filter circuit 804.

In some embodiments, SAR common mode voltage $V_{cm}$ sample and filter circuit 804 includes a sampling transistor 812, a resistor, a first capacitor, and a second capacitor. Filter circuit 804 can be a low pass RC filter employed at an input of comparator circuit 330*r* and configured to extract input common mode voltage $V_{cm}$ and filter out high frequency components while keeping the DC component. The sensed input common mode voltage $V_{cm}$ is provided by filter circuit 804.

In some embodiments, SAR input common mode voltage $V_{cm}$ sensing circuit 368 is configured to provide additional input common mode voltage $V_{cm}$ offset capability. For situations where circuit 368 cannot track the input common mode voltage $V_{cm}$ precisely. Circuit 368 can provide additional input common mode voltage $V_{cm}$ offset using capacitors 602*r* and 608*r*, switches 612*r* and 628*r* and bits $O_s$[N:0] in some embodiments. User can assign the offset using bits $O_s$[N:0] in some embodiments.

Figure 8:
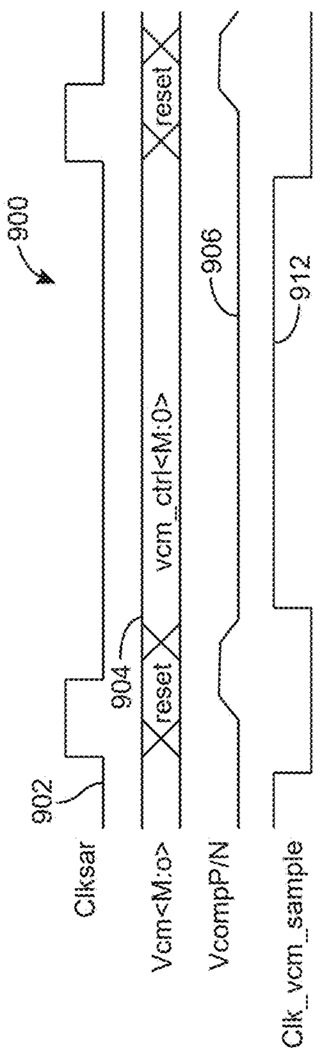
FIG. 8 is a timing diagram showing sampling of the sensed input common mode voltage Vem provided by the input common mode voltage Vem sensing circuit of the SAR ADC illustrated in FIG. 2, according to one or more embodiments.

With reference to FIG. 8, wave form diagram 900 includes a clock signal 902 (e.g., SAR CLK), replica input common mode voltage $V_{cm}$ bits 904, compP and compN signals 906, and sampling clock signal 910. Sampling clock signal 910 is provided to sampling transistor 812 for controlling sampling of the input common mode voltage $V_{cm}$ to filter circuit 804. As shown in diagram 700, replica input common mode voltage $V_{cm}$ bits 904 are set and reset by the tracking and holding edges of the clock signal 902. The signal 902 turns on the sampling transistor 812 after the replica $V_{cm}$ bits 904 are set, and turns off transistor 812 before replica $V_{cm}$ bits 904 are reset.

Figure 9:
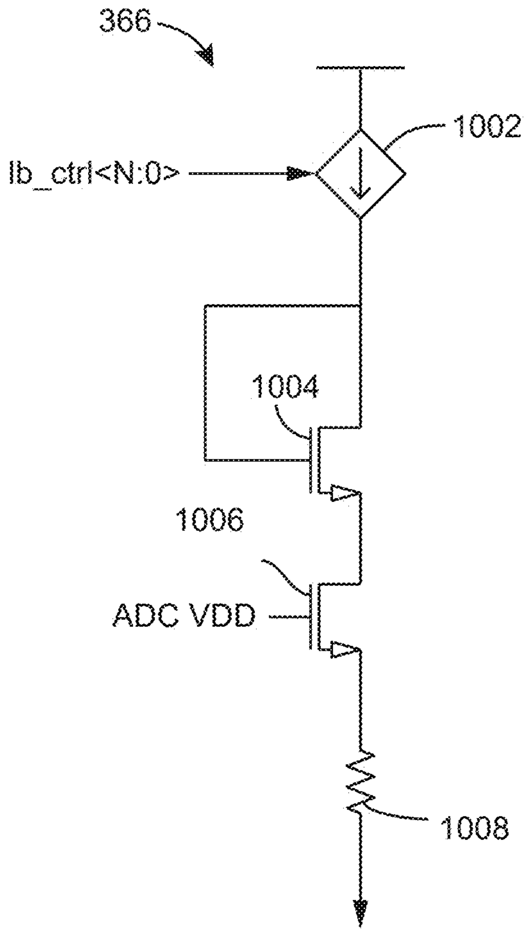
FIG. 9 is a schematic diagram of an input common mode voltage Vem target generation circuit for the SAR ADC illustrated in FIG. 2, according to one or more embodiments.

With reference to FIG. 9, target input common mode voltage $V_{cm}$ generation circuit 366 is configured as a comparator replica circuit for providing a target common mode voltage $V_{cm}$ in some embodiments. Target input common mode voltage $V_{cm}$ generation circuit 366 includes a variable current source 1002, a replica transistor 1004, a replica transistor 1006, and a resistor 1008 in some embodiments. Target input common mode voltage $V_{cm}$ generation circuit 366 can have a similar topology to comparator circuit 330 (FIG. 3).

Replica transistor 1004 is a replica of differential pair of transistors associated with comparator circuit 330, and replica transistor 1006 is a replica of a clock switch transistor associated with comparator circuit 330. Variable current source 1002 is a replica of the current source associated with comparator circuit 330.

Target input common mode voltage $V_{cm}$ generation circuit 366 is biased by a current Ib. The current value is chosen so that transistors 1004 and 1006 are in the same bias condition as in comparator circuit 330 (FIG. 3). In some embodiments, if the generated target common mode voltage $V_{cm}$ is not the optimized voltage value, the target common mode voltage $V_{cm}$ can also be programmed by applying an In_ctrl<N:0> code to current source 1002 to vary the $I_{bias}$ value, thereby allowing a user can assign an additional voltage offset to the target value.

Replica transistor 1004 is configured as a diode connected to stay in the saturation region and generate a desired Vgs voltage. Replica transistor 1006 is biased by an analog to digital converter to maintain on state, and generate a desired Vds voltage. Variable current source 1002 is configured using a resistor having a fixed voltage drop in some embodiments.

Figure 10:
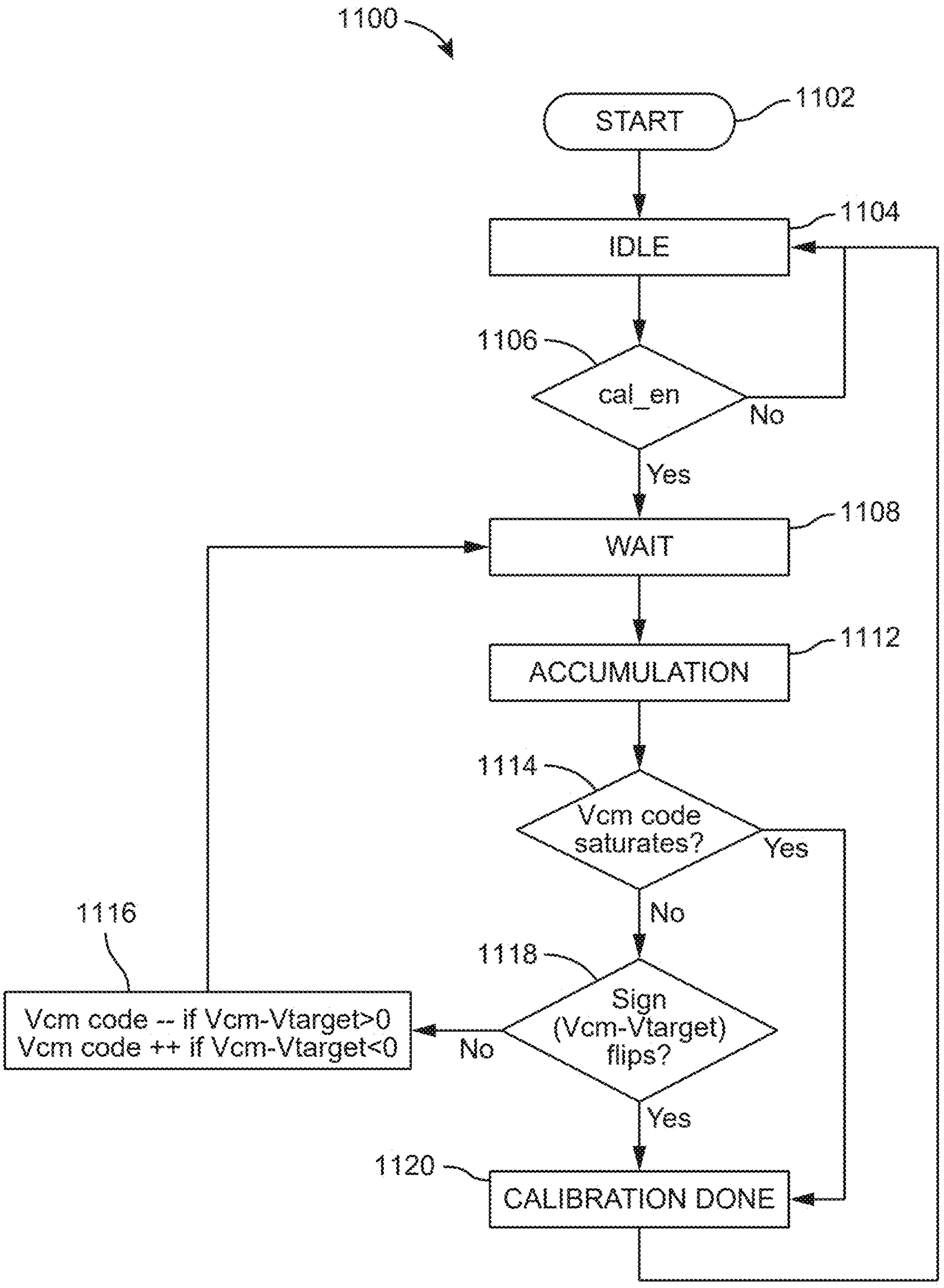
FIG. 10 is a flow diagram showing comparator bias common mode voltage Vem calibration operations for the SAR ADC illustrated in FIG. 2, according to one or more embodiments.

With reference to FIGS. 2 and 10, SAR ADC 300 can perform a flow 1100 to calibrate input common mode voltage $V_{cm}$. Flow 1100 determines the input common mode voltage $V_{cm}$ bits [M:0] or other signals or code for the best noise performance while meeting the timing requirements in some embodiments. Flow 1100 can run in both foreground and background and can run with or without data traffic.

At an operation 1102, an initial state, determines the input common mode voltage $V_{cm}$ bits [M:0] are set to a default code. At an operation 1104, flow 1100 is idle. At an operation 1106, flow 1100 determines if calibration is enabled in response to a calibration enable signal cal_en. If enabled SAR ADC 300 waits a certain time T for an output of circuit 368 to settle at an operation 1108. If not enabled, SAR ADC 300 returns to operation 1104.

After time T and operation 1108, the comparator circuit 330 compares the sensed input common mode voltage $V_{cm}$ and the target input common mode voltage $V_{cm}$ in operation 1110 and an accumulator accumulates the output of comparator 364. The accumulator can be used to determine the polarity of the difference between the sensed input common mode voltage Vcm and the target input common mode voltage $V_{cm}$ in some embodiments. After operation 1110, SAR ADC 300 determines if the input common mode voltage $V_{cm}$ bits [M:0] have saturated (reach the maximum/minimum allowed code) in an operation 1112. If so, flow 1100 advances to an operation 1118 and the calibration is complete.

If not, SAR ADC 300 advances to operation 1114, where a determination of whether the sign of the difference between the sensed input common mode voltage $V_{cm}$ and the target input common mode voltage $V_{cm}$ has changed. If so, flow 1100 advances to operation 1118. If not, flow 1100 advances to operation 1116 where the input common mode voltage $V_{cm}$ bits are increased if the output of the accumulator indicates the sensed input common mode voltage $V_{cm}$ is less than the target input common mode voltage $V_{cm}$ and the input common mode voltage $V_{cm}$ bits are decreased if the output of the accumulator indicates the sensed input common mode voltage $V_{cm}$ is more than the target input common mode voltage $V_{cm}$. Average values can be utilized. After operation 1116, flow 1100 returns to operation 1108 and operations 1110, 1112, and 1114 are repeated process until the calibration is complete in operation 1118.

Flows 500 and 1100 can be performed in in a controller of SAR ADC 300 (e.g., in calibration logic circuit 362 and comparator bias current calibration circuit 360 (FIG. 3)). Flows 500 and 1100 can include fewer operations and can be combined with other operations. Flows 500 and 1100 can be implemented in a hardware implementation or software (e.g., firmware implementation). In some embodiments, the controller is any type and form of dedicated semiconductor logic or processing circuitry capable of processing or supporting flows 500 and 1100. Flows 500 and 1100 can include software instructions provided on a non-transitory medium and can be implemented by executing the instructions on controller. Flows 500 and 1100 can be performed at chip initialization, at power on, and periodically during operation. The conversion margin can be periodically calculated to determine if adjustments need to be made as the SAR ADC 300 operates (e.g., heats up). In some embodiments, historical values of conversion margin are determined and stored. Large deltas between values can be used to initiate flows 500 and 1100. In some embodiments, the conversion margin is indicative of an amount of unused time before a bit error occurs within a sampling cycle.

It should be noted that certain passages of this disclosure can reference terms such as "first" and "second" in connection with devices or operations for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C #, or in any byte code language such as JAVA. The software programs or executable instructions can be stored on or in one or more articles of manufacture as object code. Further, certain components may be coupled together with intervening components provided there between. M, N, O and n can refer to any integer.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

The invention claimed is:

1. A device, comprising:

a first digital to analog conversion circuit comprising a plurality of first capacitors, wherein the first digital to analog conversion circuit is configured to adjust a first input voltage in response to a first control signal; and a first comparator configured to receive an adjusted input voltage from the first digital to analog conversion circuit, wherein the first control signal is provided in response to a target input voltage and a sensed input voltage and adjusts the first input voltage using the plurality of first capacitors, wherein the first control signal controls a plurality of switches coupled to respective capacitors of the plurality of first capacitors.

2. The device of claim 1, wherein the sensed input voltage is provided by a replica circuit.

3. The device of claim 2, wherein the replica circuit comprises an input filter, an output filter, and a replica digital to analog conversion circuit corresponding to the first digital to analog conversion circuit coupled between the input filter and the output filter.

4. The device of claim 3, wherein the replica circuit further comprises a replica comparator and second capacitors configured by the first control signal.

5. The device of claim 1, further comprising:

a current source configured to control a bias current for the first comparator, wherein the current source is controlled by a second control signal, the second control signal being provided in response to a conversion margin.

6. The device of claim 1, further comprising:

a current source configured to provide a bias current for the first comparator, wherein the current source is controlled by a second control signal, the second control signal being provided in response to a conversion margin;

wherein the first comparator further comprises a differential pair of transistors and a first transistor configured to receive a clock signal for enabling the first comparator, wherein the first transistor is coupled between the differential pair and the current source.

7. The device of claim 1, further comprising a plurality of digital to analog conversion units, wherein each digital to analog conversion unit of the plurality of digital to analog conversion units comprises a second circuit configured to determine a conversion margin in a unit of the second circuit.

8. The device of claim 1, wherein the first input voltage is an input common mode voltage.

9. A device, comprising:

a plurality of units, each unit comprising:

a first digital to analog conversion circuit;

a first comparator configured to receive an input voltage from the first digital to analog conversion circuit; and a current source configured to control a bias current for the first comparator, wherein the current source is controlled by a first control signal, the first control signal being provided in response to a conversion margin for the unit.

10. The device of claim 9, wherein the first digital to analog conversion circuit comprising a plurality of first capacitors, wherein the first digital to analog conversion circuit is configured to adjust a first input voltage in response to a second control signal, and wherein the first comparator is configured to receive an adjusted input voltage from the first digital to analog conversion circuit, wherein the second control signal is provided in response to a target input voltage and a sensed input voltage and adjusts the first input voltage using the plurality of first capacitors.

11. The device of claim 10, wherein the input voltage is an input common mode voltage.

12. The device of claim 10, wherein the sensed input voltage is provided by a replica circuit, wherein the replica circuit comprises an input filter, an output filter, and a replica DAC circuit corresponding to the first digital to analog conversion circuit coupled between the input filter and the output filter.

13. The device of claim 12, wherein the replica circuit further comprises a replica comparator and second capacitors configured by the second control signal.

14. The device of claim 9, wherein the first comparator further comprises a differential pair of transistors and a first transistor configured to receive a clock signal for enabling the first comparator, wherein the first transistor is coupled between the differential pair and the current source and wherein each unit of the plurality of units comprises a first circuit configured to determine the conversion margin in the unit of the first circuit.

15. A device, comprising:

a first digital to analog conversion circuit comprising a plurality of first capacitors, wherein the first digital to analog conversion circuit is configured to adjust a first input voltage in response to a first control signal;

a first comparator configured to receive an adjusted input voltage from the first digital to analog conversion circuit, wherein the first control signal is provided in response to a target input voltage and a sensed input voltage and adjusts the first input voltage using the plurality of first capacitors; and a plurality of digital to analog conversion units, wherein each digital to analog conversion unit of the plurality of digital to analog conversion units comprises a second circuit configured to determine a conversion margin in a unit of the second circuit.

16. The device of claim 15, wherein the sensed input voltage is provided by a replica circuit.

17. The device of claim 16, wherein the replica circuit comprises an input filter, an output filter, and a replica digital to analog conversion circuit corresponding to the first digital to analog conversion circuit coupled between the input filter and the output filter.

18. The device of claim 17, wherein the replica circuit further comprises a replica comparator and second capacitors configured by the first control signal.

19. The device of claim 15, further comprising:

a current source configured to control a bias current for the first comparator, wherein the current source is controlled by a second control signal, the second control signal being provided in response to the conversion margin.

20. The device of claim 15, further comprising:

a current source configured to provide a bias current for the first comparator, wherein the current source is controlled by a second control signal, the second control signal being provided in response to the conversion margin;

wherein the first comparator further comprises a differential pair of transistors and a first transistor configured to receive a clock signal for enabling the first comparator, wherein the first transistor is coupled between the differential pair and the current source.

* * * * *